US012782994B2

(12) United States Patent
Tanji

(10) Patent No.: US 12,782,994 B2
(45) Date of Patent: Nov. 3, 2026

(54) BIAS VOLTAGE GENERATOR CIRCUIT STARTING AFTER SWITCHING CONSUMPTION CURRENT BASED ON OPERATION MODE SWITCHING CONTROL SIGNAL

(71) Applicant: NISSHINBO MICRO DEVICES INC., Tokyo (JP)

(72) Inventor: Kagehito Tanji, Ikeda (JP)

(73) Assignee: NISSHINBO MICRO DEVICES INC., Tokyo (JP)

( * ) Notice: Subject to any disclaimer, the term of this patent is extended or adjusted under 35 U.S.C. 154(b) by 191 days.

(21) Appl. No.: 18/861,106

(22) PCT Filed: May 18, 2022

(86) PCT No.: PCT/JP2022/020698

§ 371 (c)(1),
(2) Date: Oct. 28, 2024

(87) PCT Pub. No.: WO2023/223468

PCT Pub. Date: Nov. 23, 2023

(65) Prior Publication Data

US 2026/0252135 A1 Aug. 27, 2026

(51) Int. Cl.
*G05F 3/26* (2006.01)
*H03F 3/45* (2006.01)

(52) U.S. Cl.
CPC ......... *G05F 3/262* (2013.01); *H03F 3/45183* (2013.01)

(58) Field of Classification Search
None
See application file for complete search history.

(56) References Cited

U.S. PATENT DOCUMENTS 6,236,194 B1 5/2001 Manabe et al.
12,204,355 B2 * 1/2025 Mii ......................... G05F 1/575
(Continued)

FOREIGN PATENT DOCUMENTS

JP 2001-117650 A 4/2001
JP 2012-054649 A 3/2012
(Continued)

OTHER PUBLICATIONS

International Search Report dated Jul. 19, 2022 in connection with PCT/JP2022/020698.

(Continued)

*Primary Examiner* — Cassandra F Cox

(57) ABSTRACT

A bias voltage generator circuit includes: a first constant current source for supplying a first constant current; a second constant current source for supplying a second constant current smaller than the first constant current; and a bias voltage generator that includes at least one first MOS transistor, and generates a predetermined bias voltage on the basis of the second constant current or the first and second constant currents. The current is supplied by using a current mirror circuit including the first MOS transistor and at least one second MOS transistor. The bias voltage generator circuit is configured based on an operation mode switching control signal. When an electronic circuit does not operate, the bias voltage generator generates a predetermined bias voltage based on the second constant current; otherwise, the bias voltage generator generates a predetermined bias voltage based on the first and second constant currents or the first constant current.

17 Claims, 21 Drawing Sheets

FIRST EMBODIMENT

(56) References Cited

U.S. PATENT DOCUMENTS

| | | | |
|---|---|---|---|
| 2014/0125300 A1 | 5/2014 | Price et al. | |
| 2016/0379564 A1 | 12/2016 | Inoue et al. | |
| 2022/0278662 A1* | 9/2022 | Kojima | H03F 3/45192 |

FOREIGN PATENT DOCUMENTS

| | | |
|---|---|---|
| JP | 2017-011704 A | 1/2017 |
| JP | 2019-053757 A | 4/2019 |

OTHER PUBLICATIONS

Nov. 28, 2024 Notification of Transmittal of Translation of the International Preliminary Report on Patentability (IPRP) in connection with PCT/JP2022/020698.

* cited by examiner

FIRST EMBODIMENT

FIRST MODIFIED EMBODIMENT

SECOND MODIFIED EMBODIMENT

THIRD MODIFIED EMBODIMENT

FOURTH MODIFIED EMBODIMENT

FIFTH MODIFIED EMBODIMENT

SIXTH MODIFIED EMBODIMENT

SEVENTH MODIFIED EMBODIMENT

SECOND EMBODIMENT

THIRD EMBODIMENT

FIFTH EMBODIMENT

SIXTH EMBODIMENT

FIRST COMPARATIVE EXAMPLE

100A

SECOND COMPARATIVE EXAMPLE

BIAS VOLTAGE GENERATOR CIRCUIT STARTING AFTER SWITCHING CONSUMPTION CURRENT BASED ON OPERATION MODE SWITCHING CONTROL SIGNAL

TECHNICAL FIELD

The present invention relates to a bias voltage generator circuit and an electronic circuit including the bias voltage generator circuit.

BACKGROUND ART

It is already known that there is a demand for reducing current consumption in order to use a rechargeable battery for a long interval of time. For example, Patent Document 1 discloses a method of selectively switching an operation mode according to an operation mode switching control signal so as to reduce current consumption as compared with an operation mode in a sleep mode.

A low dropout (LDO) regulator disclosed in Patent Document 1 includes:

(1) a pass gate that controllably couples a voltage rail to a regulator output in response to a pass gate control signal that is an operation mode switching control signal; and (2) a controllable through differential amplifier that is switchable between a slew limit state and a full through state, and is configured to receive feedback from the regulator output and generate the pass gate control signal at a full through rate in the full through state and at a reduced slew rate in the slew limit state based on a reference voltage and the feedback.

Next, a specific description will be given using a comparator circuit 100 according to a conventional example as an example.

FIG. 17 is a circuit diagram illustrating a configuration of the comparator circuit 100 according to the conventional example. In addition, FIG. 18 is a timing chart of each signal illustrating the operation of the comparator circuit 100 in FIG. 17.

Referring to FIG. 17, the comparator circuit 100 includes a comparator unit 101 and a bias voltage generator 102. The comparator unit 101 configures a general comparator by a differential amplifier and an inverter INV1, and in this case, the differential amplifier includes MOS field effect transistors (hereinafter, referred to as MOS transistors) Q1 to Q7.

In the comparator unit 101, each of the MOS transistors Q1, Q2, and Q6 is of P-channel MOS transistor, and each of the MOS transistors Q3, Q4, Q5, and Q7 is of N-channel MOS transistor. The comparator circuit 100 has a non-inverting input terminal T1, an inverting input terminal T2, a block enable signal input terminal T3, and a comparison result signal output terminal T4. In this case, during the operation of the comparator unit 101, a tail current Itail flows through the MOS transistor Q5. The output voltage of the differential amplifier is output from the connection point of the drains of the MOS transistors Q6 and Q7 to the comparison result signal output terminal T4 via the inverter INV1.

In the bias voltage generator 102, a power supply voltage VDD is connected to the sources of the MOS transistors Q1, Q2, and Q6 of the comparator unit 101 and is grounded via a constant current source CI1 that supplies a reference current IREF and switches SW1 and SW2. The connection point of the switches SW1 and SW2 generates a bias voltage VNBIAS and is applied to a drain and a gate of a MOS transistor Q8 and the gates of the MOS transistors Q5 and Q7. The sources of the MOS transistors Q8, Q5, and Q7 are grounded.

A block enable signal BLKEN, which is an operation mode switching control signal input to the block enable signal input terminal T3, is input to the control terminal of the switch SW1 and is input to the control terminal of the switch SW2 via an inverter INV2. In this case, when the H-level block enable signal BLKEN is input to the block enable signal input terminal T3, the switch SW1 is turned on and the switch SW2 is turned off. The MOS transistors Q5, Q7, and Q8 configures a current mirror circuit, the current flows through the MOS transistor Q8 according to the bias voltage VNBIAS, and a current proportional to the current flows through the MOS transistors Q5 and Q7. On the other hand, when the L-level block enable signal BLKEN is input to the block enable signal input terminal T3, the switch SW1 is turned off and the switch SW2 is turned on.

In the comparator circuit 100 configured as described above, as illustrated in FIG. 18, when the block enable signal BLKEN is switched over from the L level to the H level at time t1, when the operation mode is switched over from the sleep mode to the startup mode, the bias voltage VNBIAS goes from the pulled down state to the startup interval for which the bias voltage VNBIAS rises to a gate-to-source voltage Vgs of the MOS transistor Q8 corresponding to the reference current IREF, and then enters the active mode at time t2. In other words, the original circuit capability of the comparator circuit 100 cannot be exhibited without the startup interval from time t1 to time t2. The time required at this time depends on the magnitude of the reference current IREF and the parasitic capacitance value in the wiring of the bias voltage VNBIAS.

PRIOR ART DOCUMENT

Patent Document

Patent Document 1: Japanese Patent Laid-open Publication No. JP2019-053757A

SUMMARY OF THE INVENTION

Problems to be Solved by the Invention

However, in the method of turning on and off the circuit that is always operated as necessary as in the conventional example, there is such a problem that the stable operation cannot be performed immediately after the activation as a side effect although the consumption of the consumption current can be reduced. For example, Patent Document 1 discloses a configuration in which current sources on one side connected in parallel are turned on and off by an operation mode for the purpose of switching the tail current Itail. However, there is such a problem that the circuit cannot stably operate immediately after activation.

An object of the present invention is to solve the above problems and to provide a bias voltage generator circuit for an electronic circuit capable of starting a desired operation immediately after switching a consumption current according to an operation mode switching control signal, and an electronic circuit including the internal power supply voltage generator circuit.

Solutions to the Problems

According to the first aspect of the present invention, there is provided a bias voltage generator circuit including:

a first constant current source configured to supply a first constant current; a second constant current source configured to supply a second constant current smaller than the first constant current; and a bias voltage generator including at least one first MOS transistor and being configured to generate a predetermined bias voltage based on the second constant current or the first and second constant currents. The bias voltage generator circuit is provided for an electronic circuit to which a current is supplied by a current mirror circuit including the first MOS transistor and at least one second MOS transistor. The bias voltage generator circuit is configured, based on an operation mode switching control signal, (1) to generate a predetermined bias voltage based on the second constant current when the electronic circuit does not operate, and (2) to generate a predetermined bias voltage based on the first and second constant currents or the first constant current when the electronic circuit operates.

In addition, according to the second aspect of the present invention, there is provided an electronic circuit including a bias voltage generator circuit. The bias voltage generator circuit includes: a first constant current source configured to supply a first constant current; a second constant current source configured to supply a second constant current smaller than the first constant current; and a bias voltage generator including at least one first MOS transistor and being configured to generate a predetermined bias voltage based on the second constant current or the first and second constant currents. The bias voltage generator circuit is provided for an electronic circuit to which a current is supplied by a current mirror circuit including the first MOS transistor and at least one second MOS transistor. The bias voltage generator circuit is configured, based on an operation mode switching control signal, (1) to generate a predetermined bias voltage based on the second constant current when the electronic circuit does not operate, and (2) to generate a predetermined bias voltage based on the first and second constant currents or the first constant current when the electronic circuit operates.

Effects of the Invention

Therefore, according to the bias voltage generator circuit or the electronic circuit of the present invention, the gate voltage of the bias transistor is kept to be constant even if the current amount of the current source is reduced in order to reduce the consumption current according to the operation mode switching control signal, so that the desired operation can be started immediately after the operation mode switching control signal is switched.

DETAILED DESCRIPTION

Figure 1:
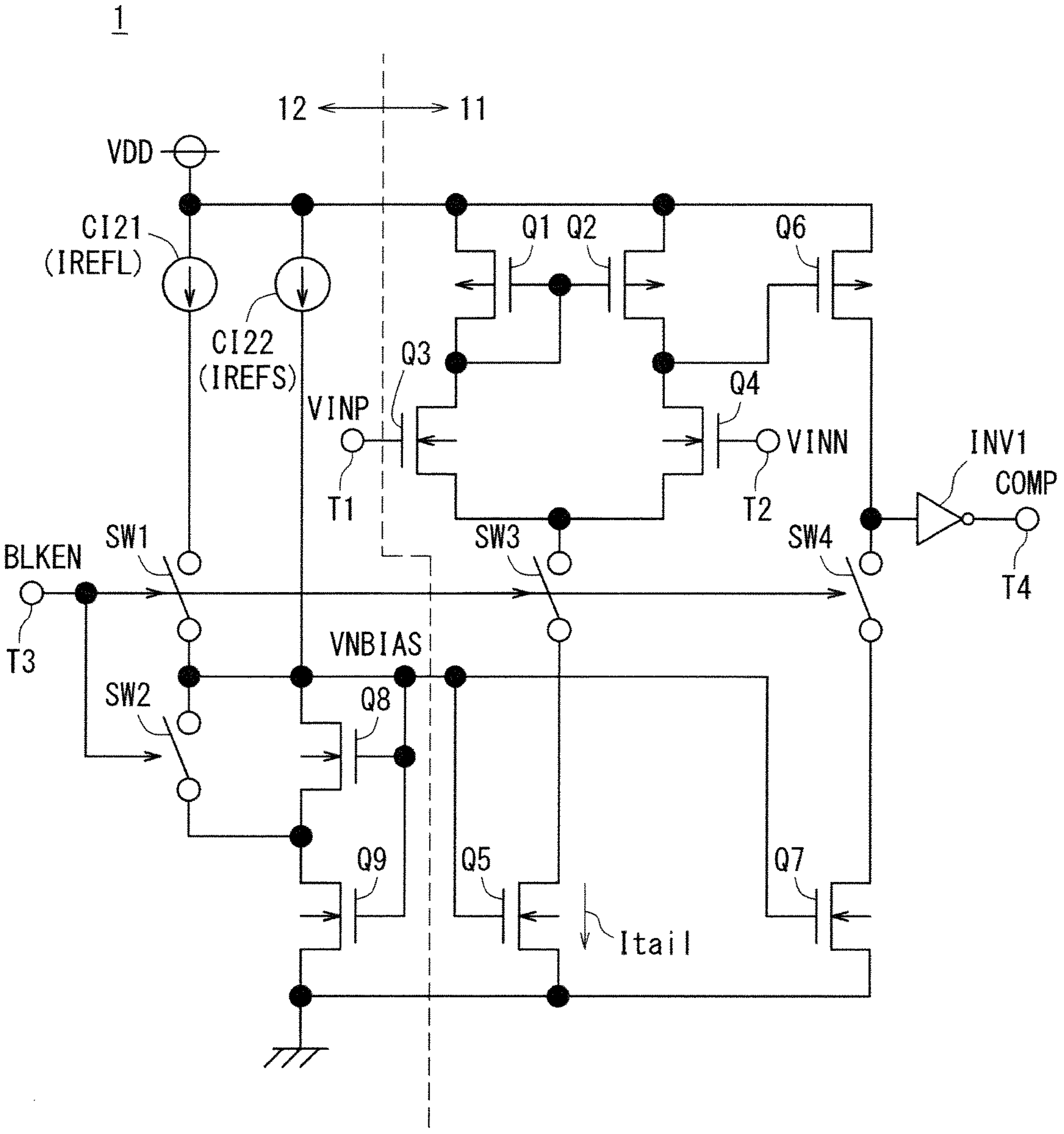
FIG. 1 is a circuit diagram illustrating a configuration example of a comparator circuit 1 according to a first embodiment.

Hereinafter, comparison examples, embodiments, and modified embodiments according to the present invention will be described with reference to the drawings. It is noted that the same or similar components are denoted by the same reference numerals.

Findings of Inventors

The embodiments according to the present invention have a feature that the gate voltage of the bias generating transistor is kept to be constant even if the amount of current of the current source is reduced in order to reduce the consumption current when it is desired to immediately operate in a necessary situation while reducing the circuit current when unnecessary.

First Comparison Example

Figure 17:
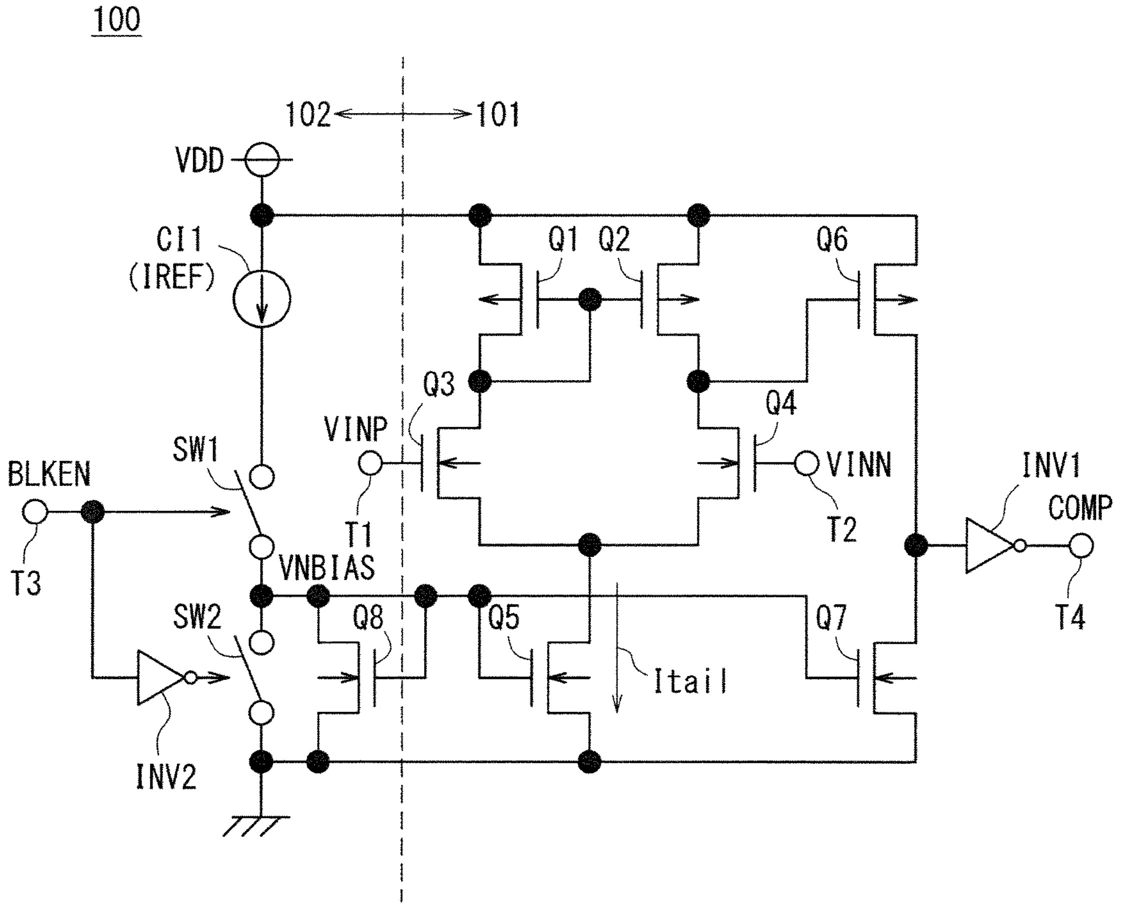
Fig. 17 PRIOR ART
FIG. 17 is a circuit diagram illustrating a configuration of the comparator circuit 100 according to the conventional example.
Figure 18:
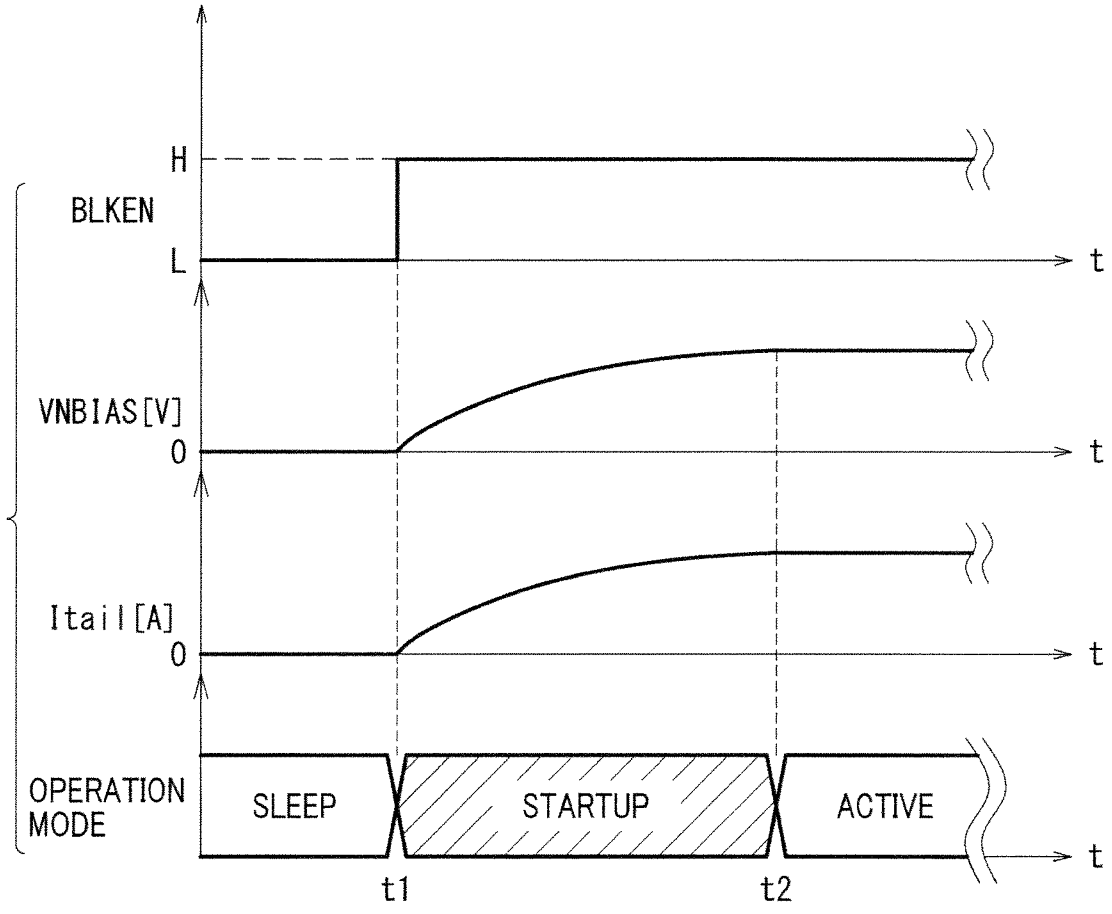
FIG. 18 is a timing chart of each signal illustrating the operation of the comparator circuit 100 in FIG. 17.
Figure 19:
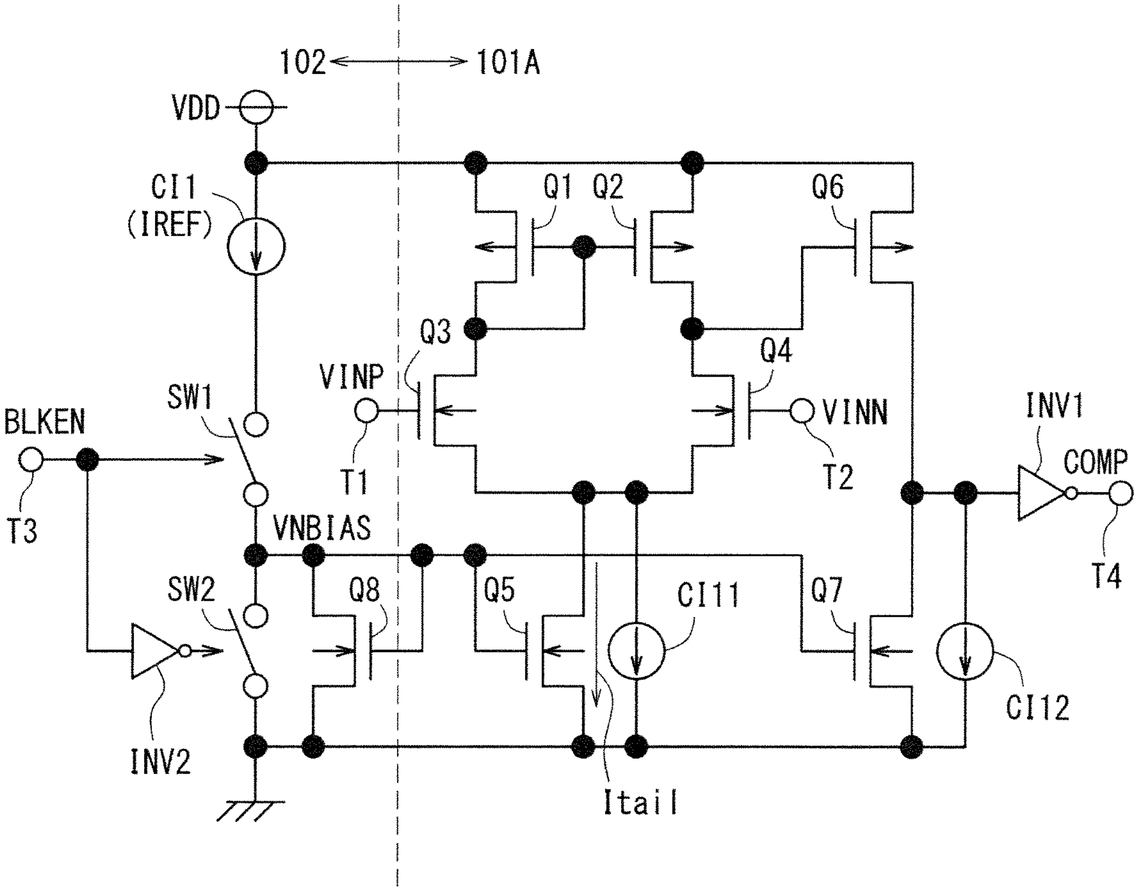
FIG. 19 is a circuit diagram illustrating a configuration example of a comparator circuit 100A according to the first comparison example.
Figure 20:
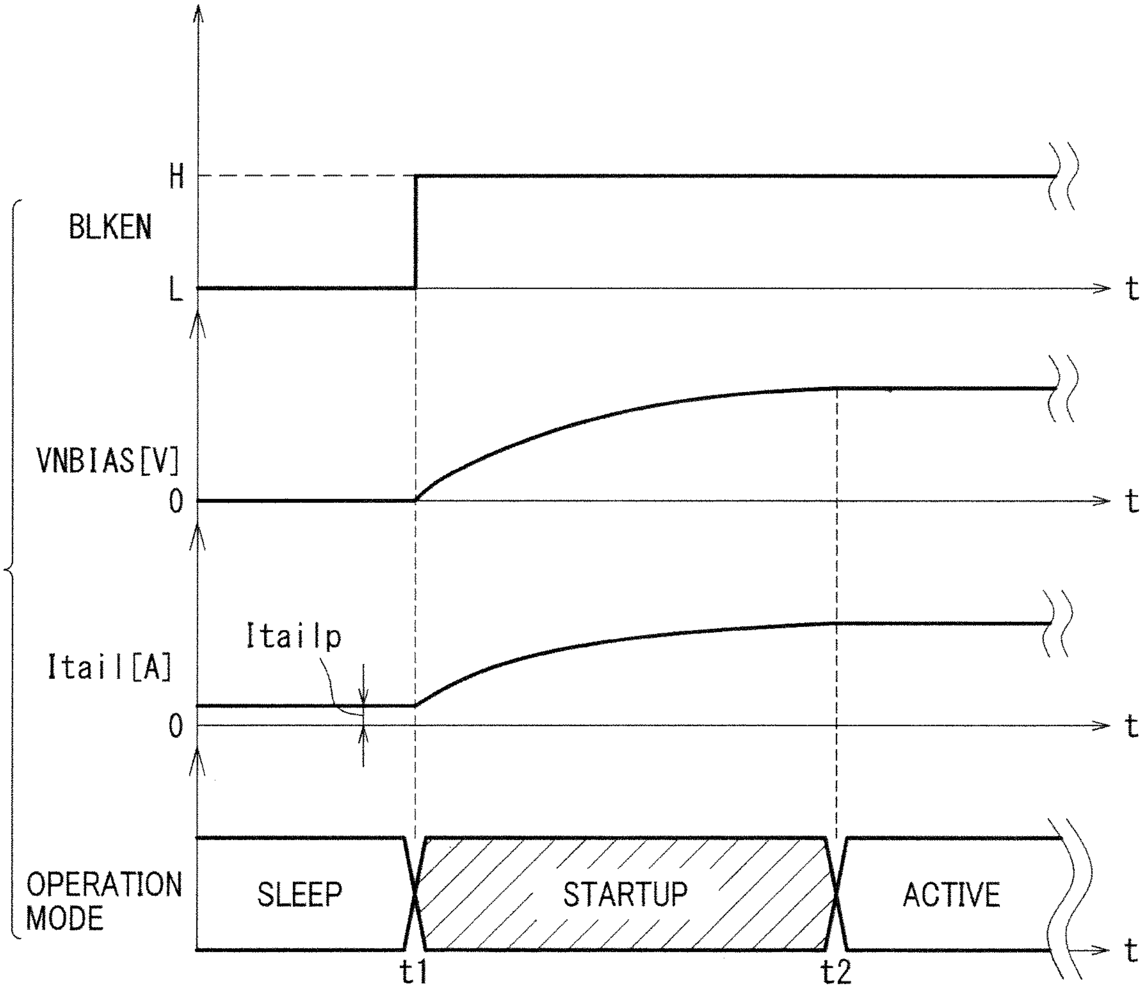
FIG. 20 is a timing chart of each signal illustrating the operation of the comparator circuit 100A in FIG. 19.

FIG. 19 is a circuit diagram illustrating a configuration example of a comparator circuit 100A according to a first comparison example. In addition, FIG. 20 is a timing chart of each signal illustrating the operation of the comparator circuit 100A in FIG. 19. The comparator circuit 100A in FIG. 19 is different from the comparator circuit 100 in FIG. 17 in the following points.

(1) The comparator unit 101A is replaced with the comparator unit 101, and the comparator unit 101A further includes constant current sources CI11 and CI12 each of which generates a preliminary current Itailp (FIG. 20).

According to the comparison example configured as described above, in order to facilitate the operation immediately after the activation, the comparator unit 101A can be configured to be operable even with a small circuit current in which a slight preliminary current Itailp (FIG. 20) is caused to flow from the constant current sources CI11 and CI12.

However, with the slight preliminary current Itailp according to the first comparison example, even if the comparator unit 101A tries to operate, it takes the same time as the unresolved circuit until the originally expected circuit operation. In addition, a preliminary current is required for each target current path, and the preliminary current needs to be increased as the current path increases.

Figure 21:
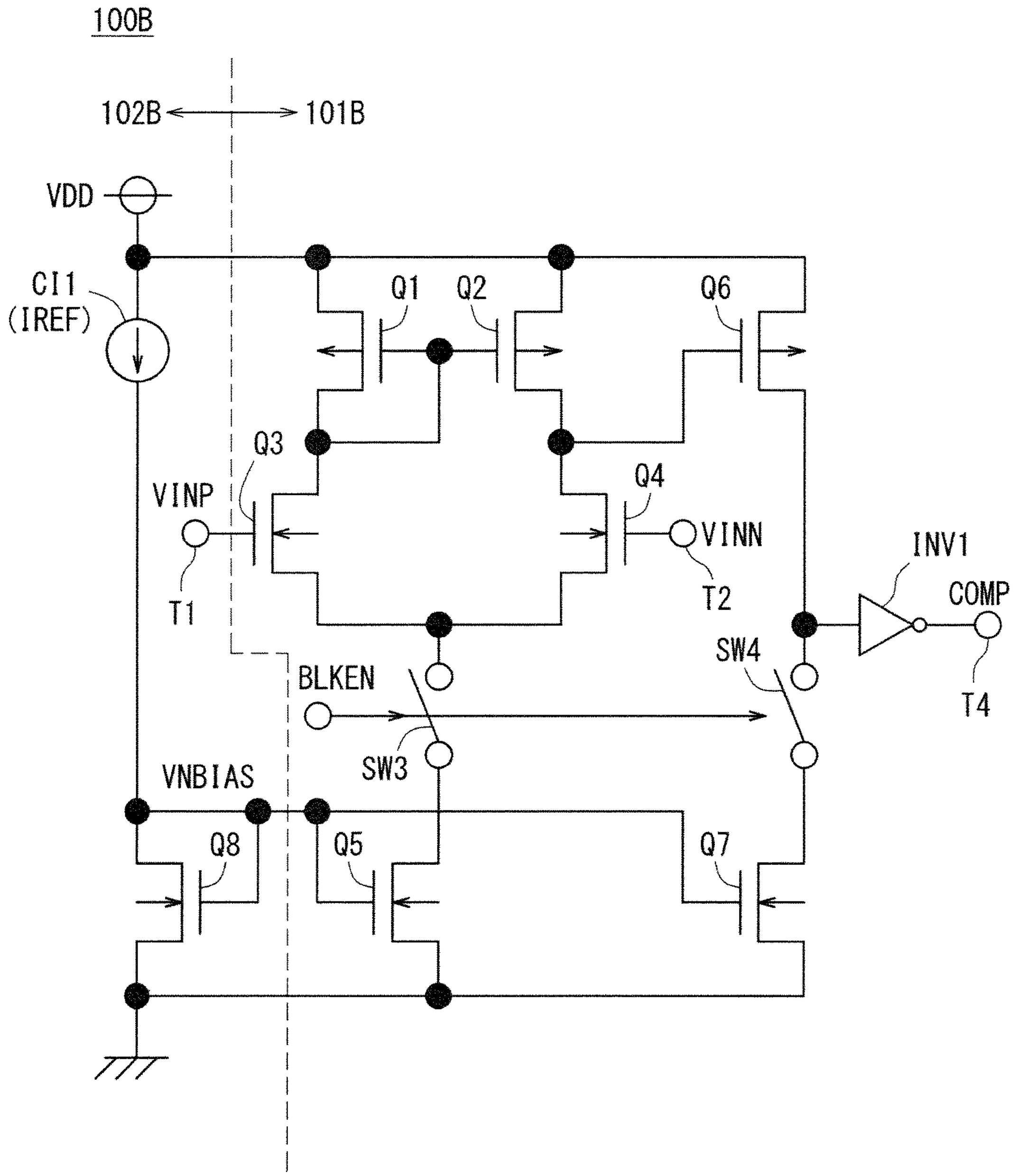
FIG. 21 is a circuit diagram showing a configuration of a comparator circuit 100B according to a second comparison example.

FIG. 21 is a circuit diagram showing a configuration of a comparator circuit 100B according to a second comparison example. The comparator circuit 100B in FIG. 21 is different from the comparator circuit 100 in FIG. 17 in the following points.

(1) A comparator unit 101B is provided instead of the comparator unit 101. The connection point between sources of MOS transistors Q3 and Q4 is grounded via a switch SW3 and a MOS transistor Q5. In addition, a drain of a MOS transistor Q6 is grounded via a switch SW4 and a MOS transistor Q7. When a block enable signal BLKEN has the H level, the switches SW3 and SW4 are turned on, and when the block enable signal BLKEN has the L level, the switches SW3 and SW4 are turned off.

(2) A bias voltage generator 102B is provided instead of the bias voltage generator 102. In this case, a power supply voltage VDD is grounded via the constant current source CI11 and a MOS transistor Q8.

According to the second comparison example configured as described above, a bias voltage VNBIAS is always applied to the gates of the MOS transistors Q5 and Q7 so that the operation can be performed immediately after the activation, and the current path is cut off to reduce the consumption. However, it is possible to reduce the circuit current and take measures against the startup time, but it is not possible to reduce the reference current IREF.

In the embodiments of the present invention, a bias voltage generator circuit capable of solving these problems and an electronic circuit including the bias voltage generator circuit will be described below.

First Embodiment

Figure 2:
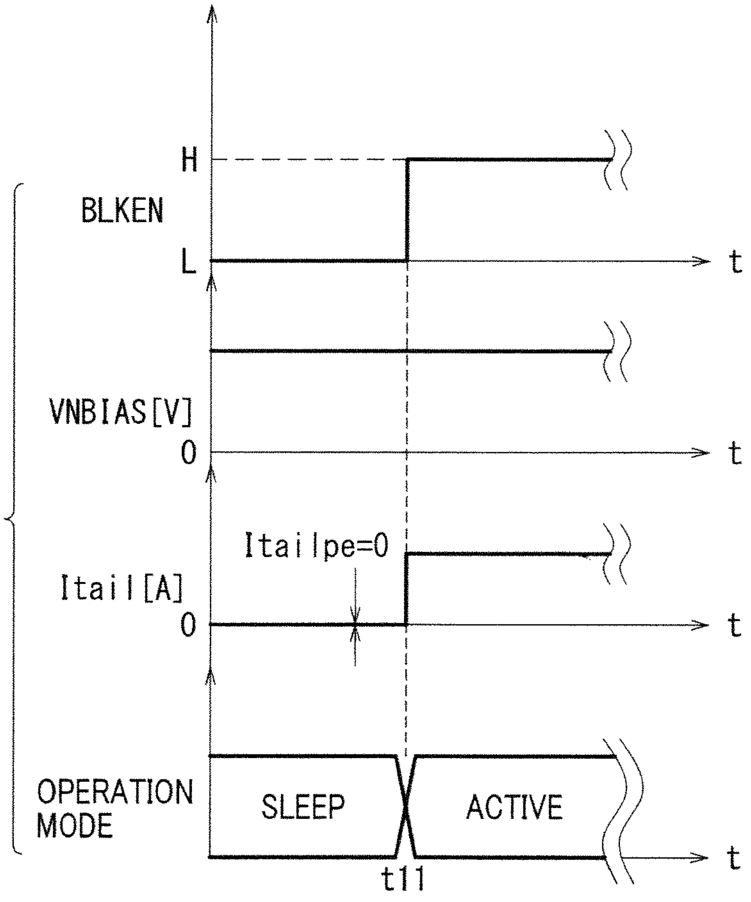
FIG. 2 is a timing chart of each signal illustrating the operation of the comparator circuit 1 in FIG. 1.

FIG. 1 is a circuit diagram illustrating a configuration example of a comparator circuit 1 according to a first embodiment. In addition, FIG. 2 is a timing chart of each signal illustrating the operation of the comparator circuit 1 in FIG. 1.

Referring to FIG. 1, the comparator circuit 1 includes a comparator unit 11 and a bias voltage generator 12. The comparator unit 11 configures a comparator by a differential amplifier and an inverter INV1, and further includes switches SW3 and SW4 as compared with the comparator unit 101 in FIG. 17. In this case, the differential amplifier includes MOS transistors Q1 to Q7. The connection point between the sources of the MOS transistors Q3 and Q4 is grounded via the switch SW3 and the MOS transistor Q5. In addition, the drain of the MOS transistor Q6 is grounded via the switch SW4 and the MOS transistor Q7.

In the comparator unit 11, the MOS transistors Q1, Q2, and Q6 are P-channel MOS transistors, and the MOS transistors Q3, Q4, Q5, and Q7 are N-channel MOS transistors. The comparator circuit 1 includes the non-inverting input terminal T1, the inverting input terminal T2, the block enable signal input terminal T3, and the comparison result signal output terminal T4. In this case, during the operation of the comparator unit 11, the tail current Itail flows through the MOS transistor Q5. The output voltage of the differential amplifier is output from the connection point of the drains of the MOS transistors Q6 and Q7 to the comparison result signal output terminal T4 via the inverter INV1.

In the bias voltage generator 12, a power supply voltage VDD is connected to the sources of the MOS transistors Q1, Q2, and Q6 of the comparator unit 11, and is grounded via a constant current source CI21 that supplies a first reference current IREFL, the switches SW1 and SW2, and a MOS transistor Q9. In addition, the power supply voltage VDD is grounded via a constant current source CI22 that supplies a second reference current IREFS (<IREFL) and the MOS transistors Q8 and Q9. The connection point of the switches SW1 and SW2 generates a bias voltage VNBIAS and is applied to the drain and the gate of the MOS transistor Q8, the gate of the MOS transistor Q9, and the gates of the MOS transistors Q5 and Q7. The sources of the MOS transistors Q9, Q5, and Q7 are grounded.

A block enable signal BLKEN, which is an operation mode switching control signal input to the block enable signal input terminal T3, is input to the control terminal of the switch SW1 and the control terminal of the switch SW2. In this case, when the H-level block enable signal BLKEN is input to the block enable signal input terminal T3, the switches SW1 and SW2 are turned on. The MOS transistors Q5, Q7, and Q9 configures a current mirror circuit, a current flows through the MOS transistor Q9 according to the bias voltage VNBIAS, and a current proportional to the current flows through the MOS transistors Q5 and Q7. On the other hand, when the L-level block enable signal BLKEN is input to the block enable signal input terminal T3, the switches SW1 and SW2 are turned off. The gates of the MOS transistors Q1 to Q9 each are control terminals.

In the comparator circuit 1 configured as described above, as illustrated in FIG. 2, the block enable signal BLKEN is switched over from the L level to the H level at time t11, and the operation mode is switched over from a sleep mode to an active mode. In this case, as follows.

(1) In the sleep mode (when the comparator circuit 1 does not operate), both the switches SW1 and SW2 are tuned off, and only the constant current source CI22 causes the constant current IREFS to flow through the series circuit of the MOS transistors Q8 and Q9. As a result, the bias voltage VNBIAS corresponding to the constant current IREFS is generated (Itailpe=0).

(2) In the active mode (when the comparator circuit 1 operates), both the switches SW1 and SW2 are turned on, and the constant current sources CI21 and CI22 cause the constant currents IREFL and IREFS to flow through the MOS transistor Q9, respectively. As a result, the bias voltage VNBIAS corresponding to the constant current (IREFL+IREFS) is generated, and a tail current Itail corresponding to the constant current (IREFL+IREFS) flows through the MOS transistor Q5.

That is, the size of the MOS transistor on the diode connection (connecting the gate and the drain) side of the current mirror circuit configured by the MOS transistors Q8, Q9, Q5, and Q7 is switched, the bias voltage VNBIAS generated with the constant current IREFS in which the current is reduced in the sleep mode and the bias voltage VNBIAS generated with the constant current IREFL+IREFS originally desired to flow in the active mode are combined, and the tail current Itail corresponding to the addition value of the two constant currents IREFL and IREFS can be immediately caused to flow at time t11.

Figure 3:
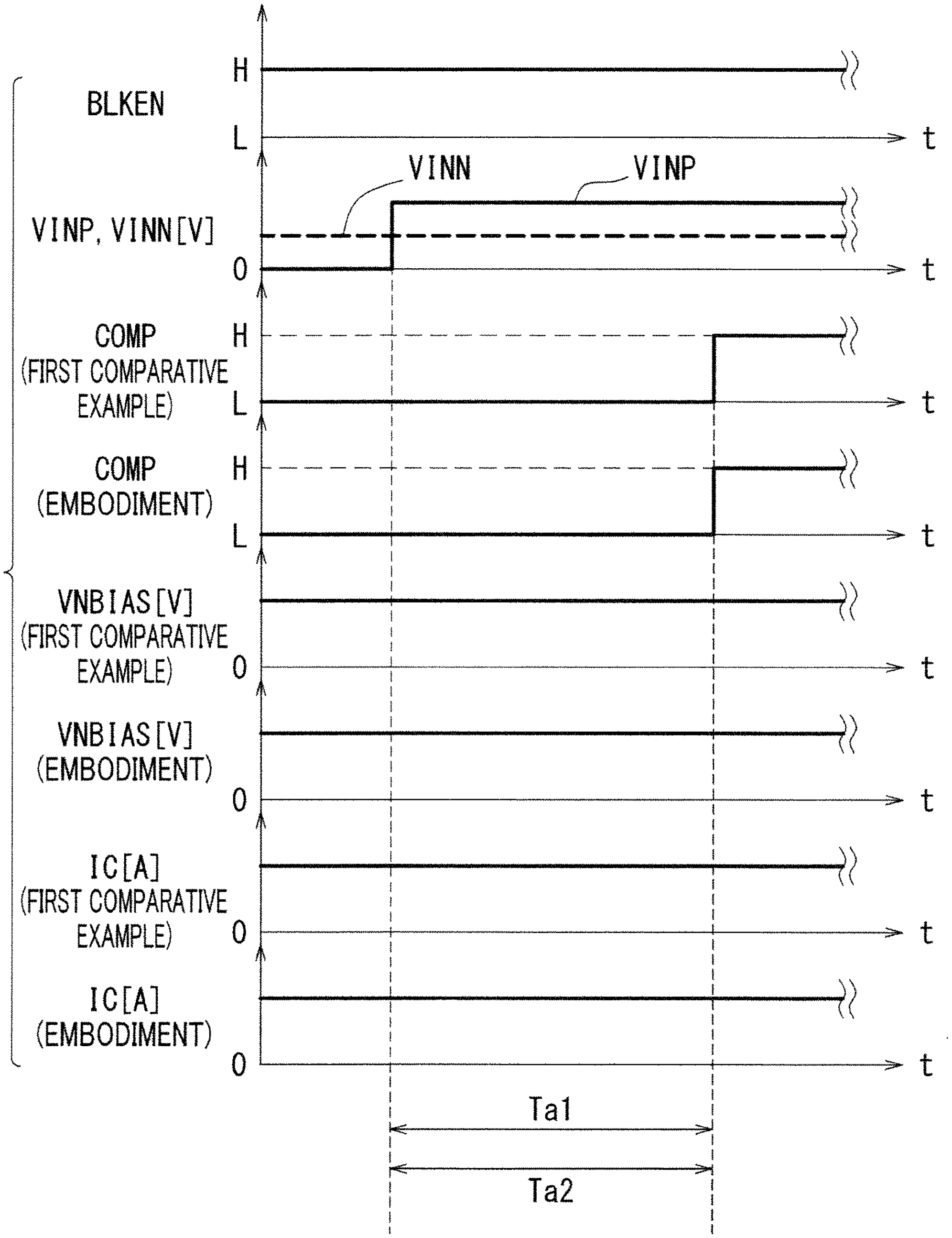
FIG. 3 is a diagram illustrating a comparison of operations between a comparator circuit 100 according to a first comparison example and the comparator circuit 1 according to the embodiment, and is a timing chart of each signal when a bias voltage VNBIAS sufficiently rises to a predetermined voltage at the time of signal detection.

FIG. 3 is a diagram illustrating a comparison of operations between the comparator circuit 100 according to the first comparison example and the comparator circuit 1 according to the embodiment, and is a timing chart of each signal when the bias voltage VNBIAS sufficiently rises to a predetermined voltage at the time of signal detection. In addition, FIG. 4 is a diagram illustrating a comparison of operations between the comparator circuit 100 according to the first comparison example and the comparator circuit 1 according to the embodiment, and is a timing chart of each signal when the bias voltage VNBIAS sufficiently rises to a predetermined voltage at the time of signal detection.

Figure 4:
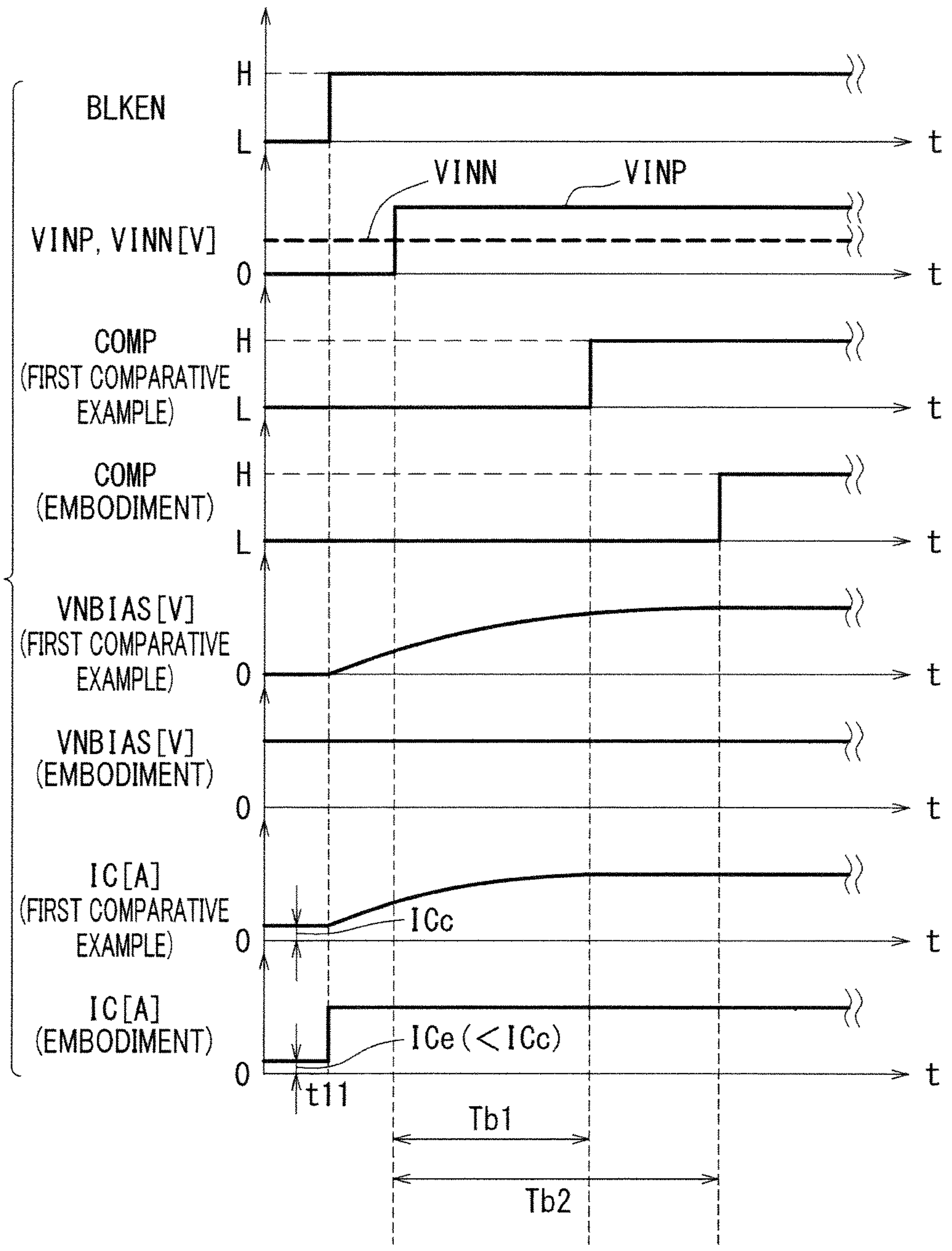
FIG. 4 is a diagram illustrating a comparison of operations between the comparator circuit 100 according to the first comparison example and the comparator circuit 1 according to the embodiment, and is a timing chart of each signal when the bias voltage VNBIAS sufficiently rises to a predetermined voltage at the time of signal detection.

As is clear from FIGS. 3 and 4, in the first comparison example, there is a difference in detection delay time between a case where the bias voltage VNBIAS sufficiently rises at the time of detection (FIG. 3) and a case where the bias voltage VNBIAS is in the middle of rising (FIG. 4). That is, Ta1≠Tb1. On the other hand, in the first embodiment, the predetermined tail current Itail can be caused to flow immediately after the block enable signal BLKEN rises from the L level to the H level (time t11). That is, in these two cases, there is no difference in detection delay time, and Ta2=Tb2. In addition, the consumption current ICe of the first embodiment in the sleep mode is smaller than the consumption current ICc of the first comparison example. As described above, the first embodiment has the above-described specific effects as compared with the comparison example.

As described above, according to the first embodiment, the desired comparison operation can be started immediately after the switching to the increased consumption current according to the block enable signal BLKEN which is the operation mode switching control signal.

First Modified Embodiment

Figure 5:
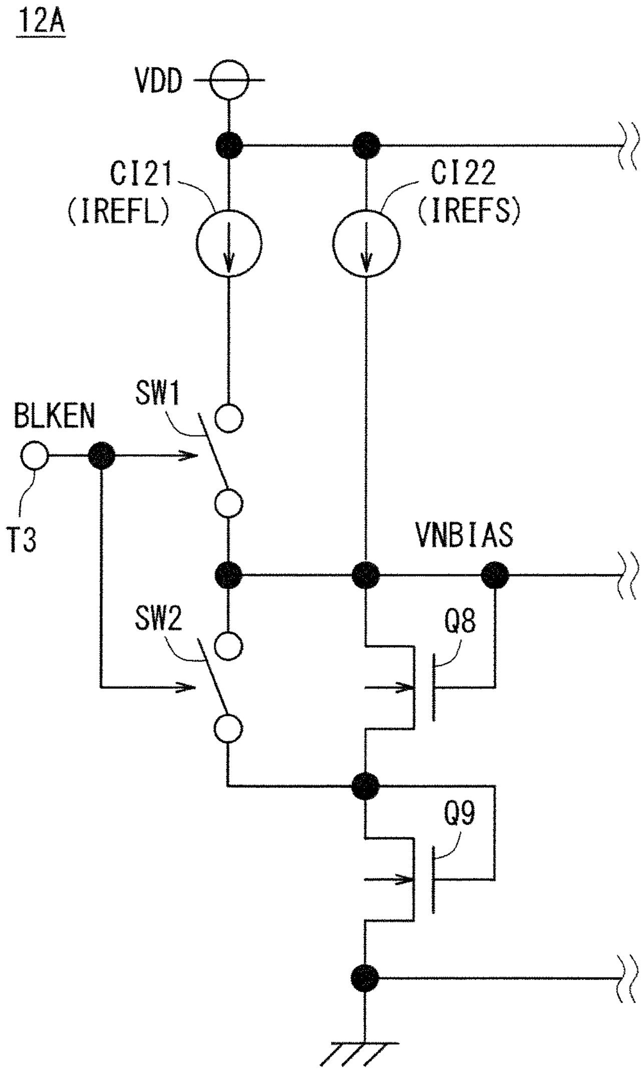
FIG. 5 is a circuit diagram illustrating a configuration example of a bias voltage generator 12A according to a first modified embodiment.

FIG. 5 is a circuit diagram illustrating a configuration example of a bias voltage generator 12A according to a first modified embodiment. The bias voltage generator 12A in FIG. 5 is different from the bias voltage generator 12 in FIG. 1 in the following points.

(1) The gate and the drain of each of the MOS transistors Q8 and Q9 are diode-connected.

It is noted that the comparator unit 11 in FIG. 1 is used.

The comparator circuit including the bias voltage generator 12A configured as described above operates in a manner similar to that of the comparator circuit 1 of the first embodiment except for the operation difference in the above configuration.

Second Modified Embodiment

Figure 6:
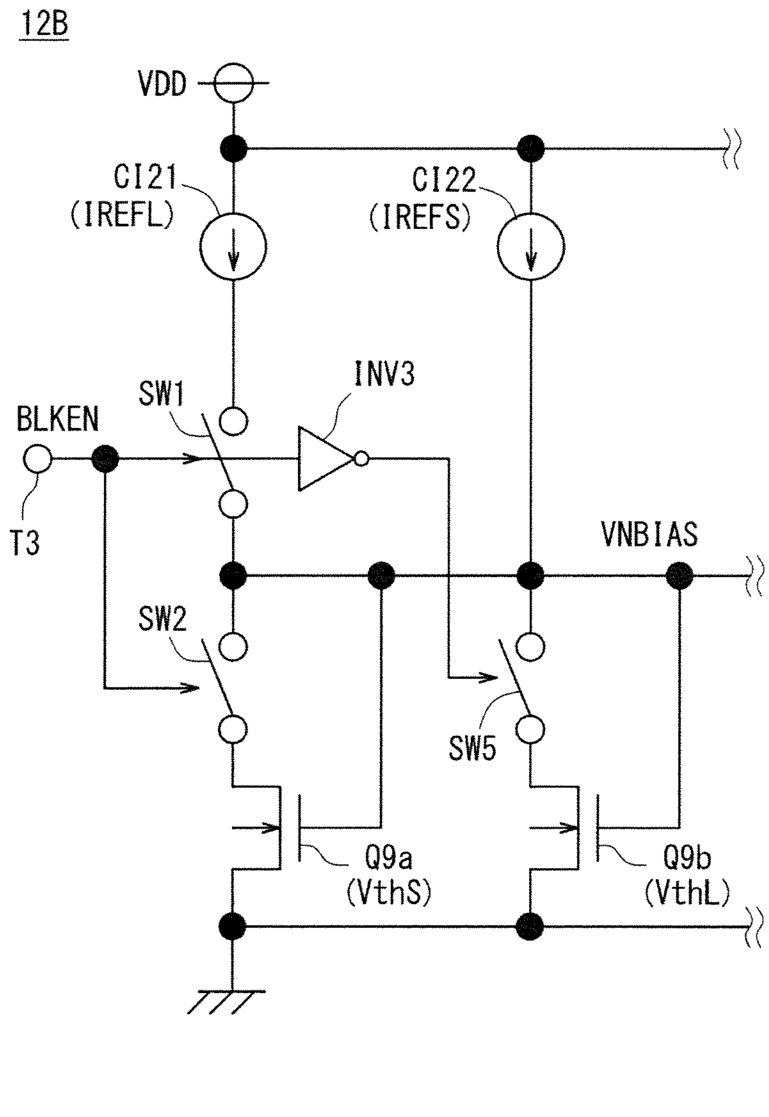
FIG. 6 is a circuit diagram illustrating a configuration example of a bias voltage generator 12B according to a second modified embodiment.

FIG. 6 is a circuit diagram illustrating a configuration example of a bias voltage generator 12B according to a second modified embodiment. The bias voltage generator 12B in FIG. 6 is different from the bias voltage generator 12 in FIG. 1 in the following points.

(1) The power supply voltage VDD is grounded via the constant current source CI21 that supplies the constant current IREFL, the switch SW1, the switch SW2, and a MOS transistor Q9*a* having a threshold VthS.

(2) The power supply voltage VDD is grounded via the constant current source CI22 that supplies the constant current IREFS (<IREFL), the connection point of SW1 and SW2, the switch SW5, and a MOS transistor Q9*b* having a threshold VthL (>VthS). The connection point of SW1 and SW2 is connected to the gate of the MOS transistor Q9*a* and the gate of the MOS transistor Q9*b*.

(3) The block enable signal BLKEN is applied to the control terminals of the switches SW1 and SW2, and is also applied to the control terminal of the switch SW5 via an inverter INV3.

It is noted that the comparator unit 11 in FIG. 1 is used.

In the bias voltage generator 12B configured as described above, when the L-level block enable signal BLKEN is input, the switch SW5 is turned on, while the switches SW1 and SW2 are turned off. In addition, when the H-level block enable signal BLKEN is input, the switch SW5 is turned off, while the switches SW1 and SW2 are turned on.

The comparator circuit having the bias voltage generator 12B configured as described above operates in a manner similar to that of the comparator circuit 1 of the first embodiment except for the operation difference in the above configuration.

Third Modified Embodiment

Figure 7:
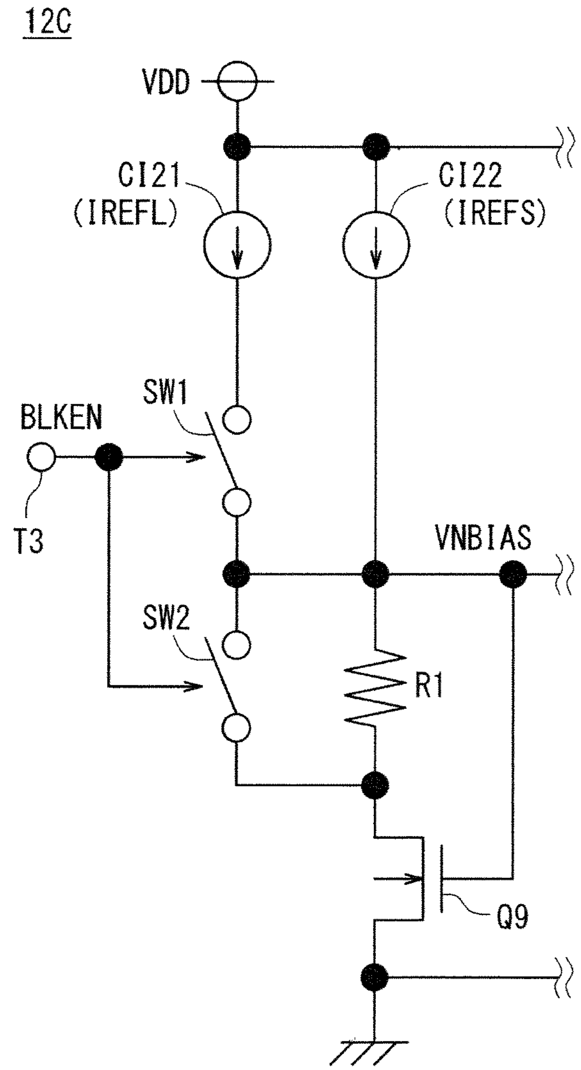
FIG. 7 is a circuit diagram illustrating a configuration example of a bias voltage generator 12C according to a third modified embodiment.

FIG. 7 is a circuit diagram illustrating a configuration example of a bias voltage generator 12C according to a third modified embodiment. The bias voltage generator 12C in FIG. 7 is different from the bias voltage generator 12 in FIG. 1 in the following points.

(1) A resistor R1 is provided instead of the MOS transistor Q8.

It is noted that the comparator unit 11 in FIG. 1 is used.

The comparator circuit including the bias voltage generator 12C configured as described above operates in a manner similar to that of the comparator circuit 1 of the first embodiment except for the operation difference in the above configuration.

Fourth Modified Embodiment

Figure 8:
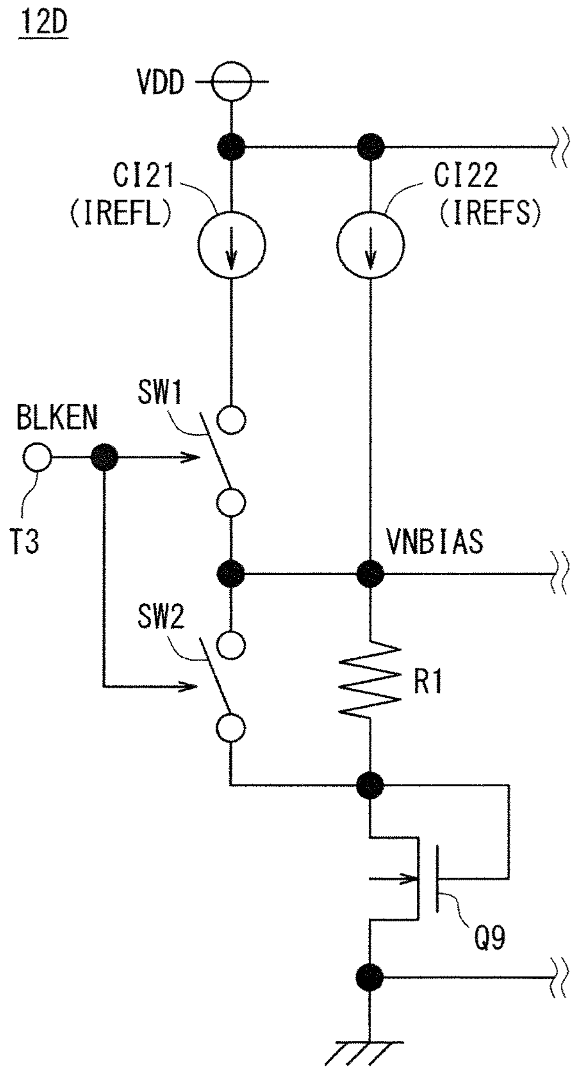
FIG. 8 is a circuit diagram illustrating a configuration example of a bias voltage generator 12D according to a fourth modified embodiment.

FIG. 8 is a circuit diagram illustrating a configuration example of a bias voltage generator 12D according to a fourth modified embodiment. The bias voltage generator 12D in FIG. 8 is different from the bias voltage generator 12A in FIG. 5 in the following points.

(1) The resistor R1 is provided instead of the MOS transistor Q8.

It is noted that the comparator unit 11 in FIG. 1 is used.

The comparator circuit including the bias voltage generator 12D configured as described above operates in a manner similar to that of the comparator circuit of the first modified embodiment except for the operation difference in the above configuration.

Fifth Modified Embodiment

Figure 9:
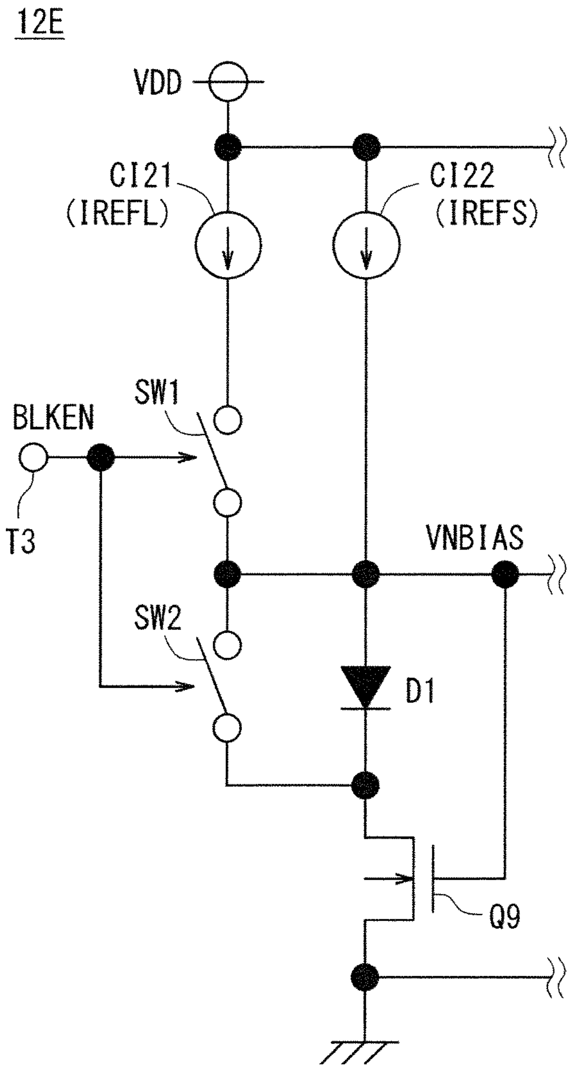
FIG. 9 is a circuit diagram illustrating a configuration example of a bias voltage generator 12E according to a fifth modified embodiment.

FIG. 9 is a circuit diagram illustrating a configuration example of a bias voltage generator 12E according to a fifth modified embodiment. The bias voltage generator 12E in FIG. 9 is different from the bias voltage generator 12C in FIG. 7 in the following points.

(1) The diode D1 is provided instead of the resistor R1. In this case, the anode of the diode D1 is connected to the constant current source CI22, and the cathode thereof is connected to the drain and the gate of the MOS transistor Q9.

It is noted that the comparator unit 11 in FIG. 1 is used.

The comparator circuit including the bias voltage generator 12E configured as described above operates in a manner similar to that of the comparator circuit of the third modified embodiment except for the operation difference in the above configuration.

Sixth Modified Embodiment

Figure 10:
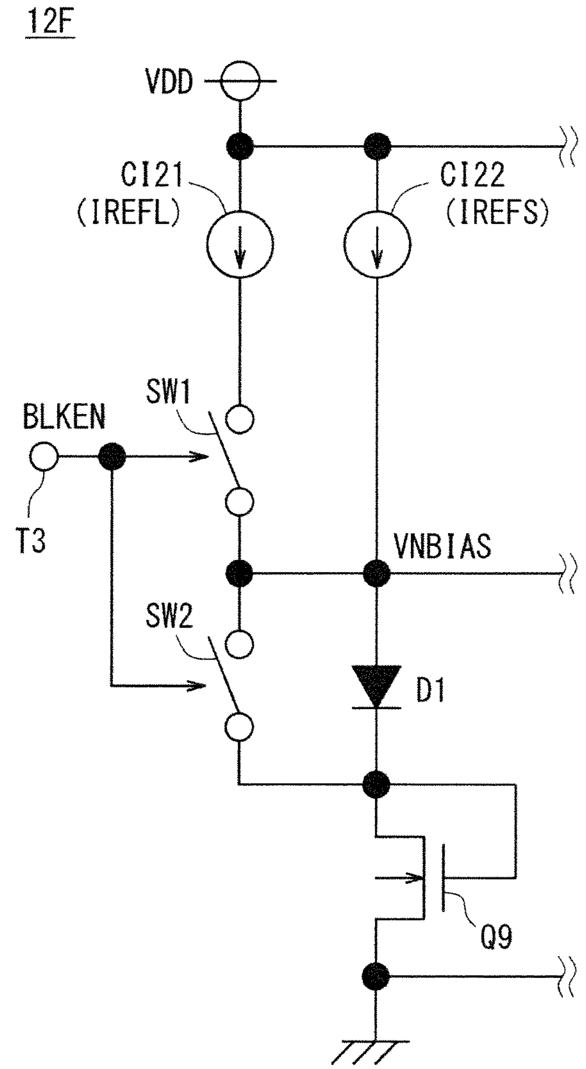
FIG. 10 is a circuit diagram illustrating a configuration example of a bias voltage generator 12F according to a sixth modified embodiment.

FIG. 10 is a circuit diagram illustrating a configuration example of a bias voltage generator 12F according to a sixth modified embodiment. The bias voltage generator 12F in FIG. 10 is different from the bias voltage generator 12D in FIG. 8 in the following points.

(1) The diode D1 is provided instead of the resistor R1. In this case, the anode of the diode D1 is connected to the constant current source CI22, and the cathode thereof is connected to the drain and the gate of the MOS transistor Q9.

It is noted that the comparator unit 11 in FIG. 1 is used.

The comparator circuit including the bias voltage generator 12F configured as described above operates in a manner similar to that of the comparator circuit of the fourth modified embodiment except for the operation difference in the above configuration.

Seventh Modified Embodiment

Figure 11:
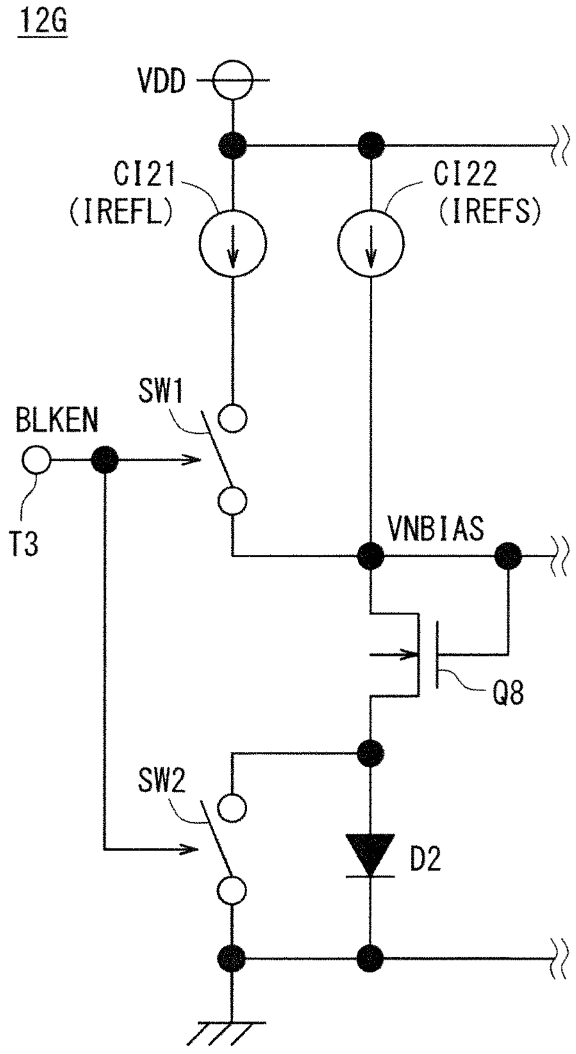
FIG. 11 is a circuit diagram illustrating a configuration example of a bias voltage generator 12G according to a seventh modified embodiment.

FIG. 11 is a circuit diagram illustrating a configuration example of a bias voltage generator 12G according to a seventh modified embodiment. The bias voltage generator 12G in FIG. 11 is different from the bias voltage generator 12A in FIG. 5 in the following points.

(1) A diode D2 is provided instead of the MOS transistor Q9. In this case, the anode of the diode D2 is connected to the source of the MOS transistor Q8, and the cathode thereof is grounded.

(2) The switch SW2 is connected to both ends of the diode D2, and both ends of the diode D2 are short-circuited or opened based on the block enable signal BLKEN.

It is noted that the comparator unit 11 in FIG. 1 is used.

The comparator circuit including the bias voltage generator 12G configured as described above operates in a manner similar to that of the comparator circuit of the first modified embodiment except for the operation difference in the above configuration.

It is noted that the MOS transistor, the resistor, and the diode used in the first embodiment and the first to seventh modified embodiments described above can also be arranged on the ground side of the MOS transistor serving as a reference of the current mirror circuit.

Second Embodiment

Figure 12:
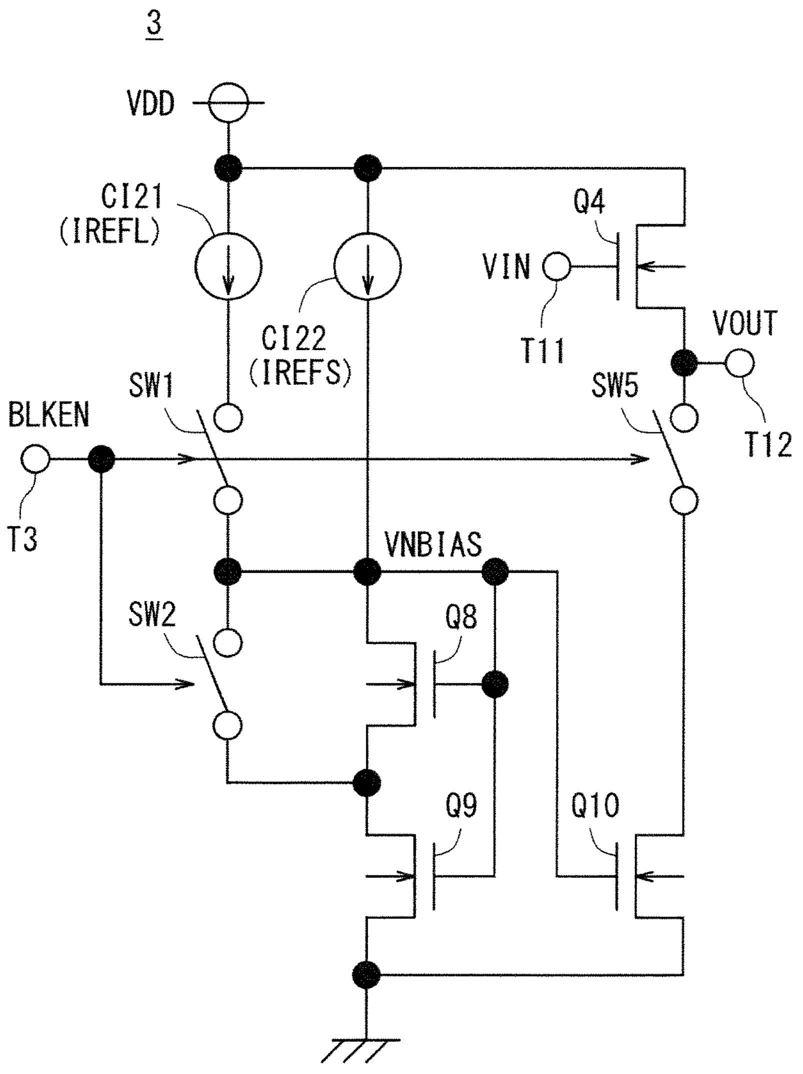
FIG. 12 is a circuit diagram illustrating a configuration example of a source follower circuit 3 according to a second embodiment.

FIG. 12 is a circuit diagram illustrating a configuration example of a source follower circuit 3 according to a second embodiment.

Referring to FIG. 12, the source follower circuit 3 includes an input terminal T11, an output terminal T12, and the block enable signal input terminal T3, and includes the bias voltage generator 12 in FIG. 1, the MOS transistor Q4, a switch SW5, and a MOS transistor Q10. In this case, the MOS transistors Q4 and Q10 include N-channel MOS transistors.

The power supply voltage VDD is grounded via the MOS transistor Q4, the switch SW5, and the MOS transistor Q10. The bias voltage VNBIAS is applied to the gate of the MOS transistor Q10. An input voltage VIN is input to the input terminal T11, and an output voltage Vout is output from the output terminal T12 during the operation of the source follower circuit 3.

In the source follower circuit 3 configured as described above, when a L-level block enable signal BLKEN is applied, the switches SW1 and SW2 are turned off, and the constant current source CI22 of the bias voltage generator 12 operates. In addition, when the H-level block enable signal BLKEN is applied, the constant current sources CI21 and CI22 operate, the constant current increases from IREFS to (IREFS+IREFL), and the increased bias voltage VNBIAS corresponding to the current is applied to the gate of the MOS transistor Q10.

In the source follower circuit 3 configured as described above, the block enable signal BLKEN is switched over from the L level to the H level, and the operation mode is switched over from a sleep mode to an active mode. At this time, as described above, the constant current sources CI21 and CI22 operate, the constant current increases from IREFS to (IREFS+IREFL), and the increased bias voltage VNBIAS corresponding to the current is applied to the gate of the MOS transistor Q10, so that the source follower circuit 3 can be immediately put into the operating state.

As described above, according to the second embodiment, the desired operation can be started immediately after switching to the increased consumption current according to the block enable signal BLKEN which is the operation mode switching control signal.

The bias voltage generator in FIG. 12 may be configured by the bias voltage generators 12A to 12G of the first to seventh modified embodiments in FIGS. 5 to 11 instead of the bias voltage generator in FIG. 12.

Third Embodiment

Figure 13:
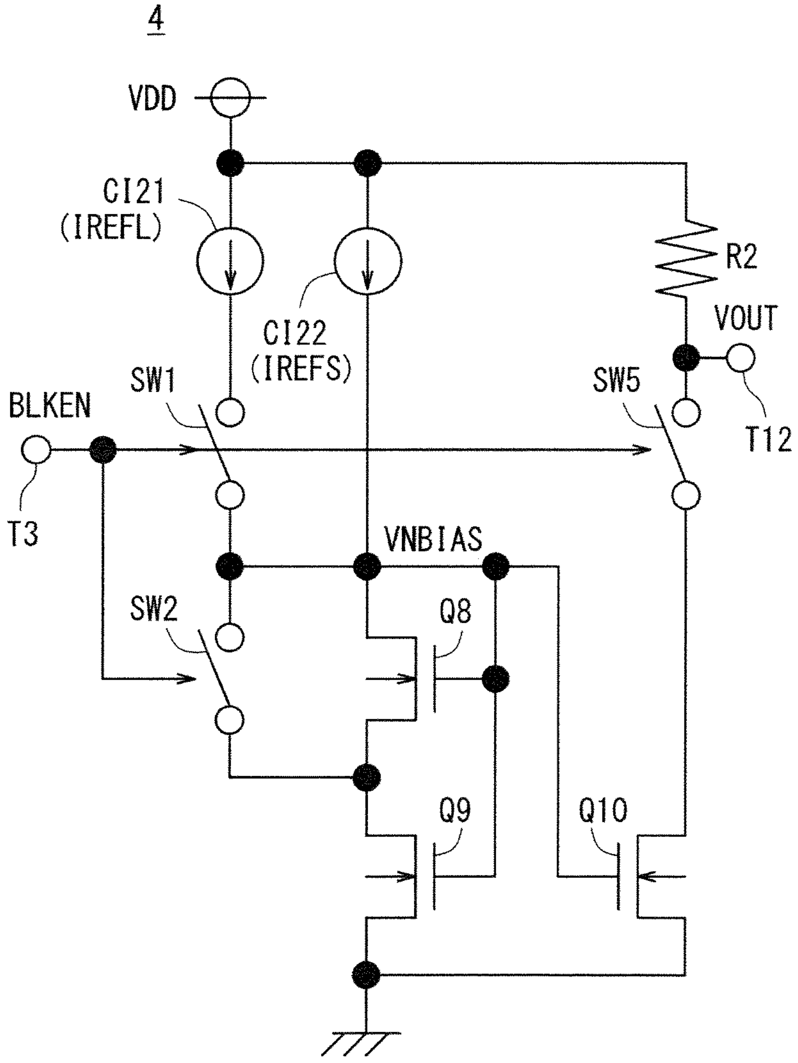
FIG. 13 is a circuit diagram illustrating a configuration example of a voltage generator circuit 4 according to a third embodiment.

FIG. 13 is a circuit diagram illustrating a configuration example of a voltage generator circuit 4 according to a third embodiment. The voltage generator circuit 4 of FIG. 13 is different from the source follower circuit 3 of FIG. 12 in the following points.

(1) A resistor R2 is provided instead of the MOS transistor Q4.

The voltage generator circuit 4 configured as described above operates when the H-level block enable signal BLKEN is input, and can generate and output a predetermined voltage determined by the resistor R2 and the MOS transistor Q10 from the output terminal T12.

As described above, according to the third embodiment, the desired voltage generation operation can be started immediately after switching to the increased consumption current according to the block enable signal BLKEN which is the operation mode switching control signal.

The voltage generator circuit 4 in FIG. 13 may be configured by the bias voltage generators 12A to 12G of the first to seventh modified embodiments in FIGS. 5 to 11 instead of the bias voltage generator in FIG. 13.

Fourth Embodiment

Figure 14:
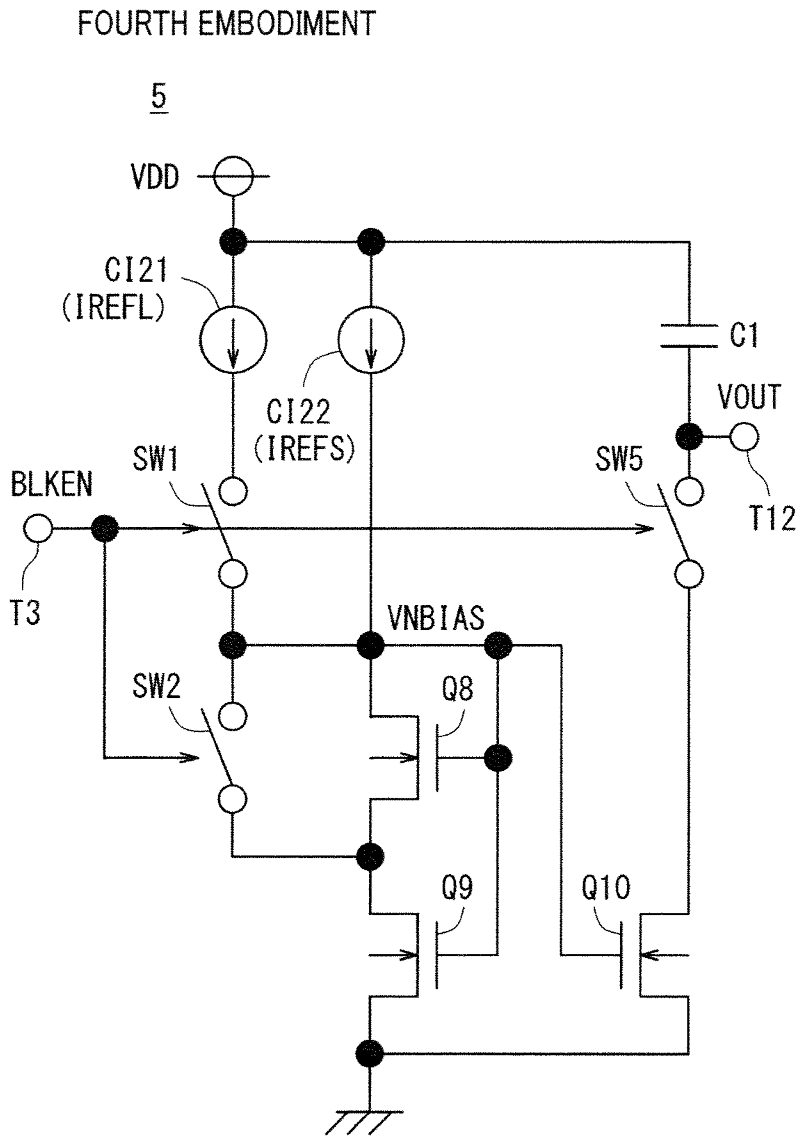
FIG. 14 is a circuit diagram illustrating a configuration example of a time constant circuit 5 according to a fourth embodiment.

FIG. 14 is a circuit diagram illustrating a configuration example of a time constant circuit 5 according to a fourth embodiment. The time constant circuit 5 in FIG. 14 is different from the voltage generator circuit 4 in FIG. 13 in the following points.

(1) A capacitor C1 is provided instead of the resistor R2.

The time constant circuit 5 configured as described above operates when the H-level block enable signal BLKEN is input, and can generate and output, from the output terminal T12, a voltage that decreases at a predetermined time constant determined by the current values of the capacitor C1 and a MOS transistor Q10.

As described above, according to the fourth embodiment, the voltage generation operation having a desired time constant can be started immediately after switching to the increased consumption current according to the block enable signal BLKEN which is the operation mode switching control signal.

It is noted that the time constant circuit 5 in FIG. 14 may include the bias voltage generators 12A to 12G of the first to seventh modified embodiments in FIGS. 5 to 11 instead of the bias voltage generator in FIG. 14.

Fifth Embodiment

Figure 15:
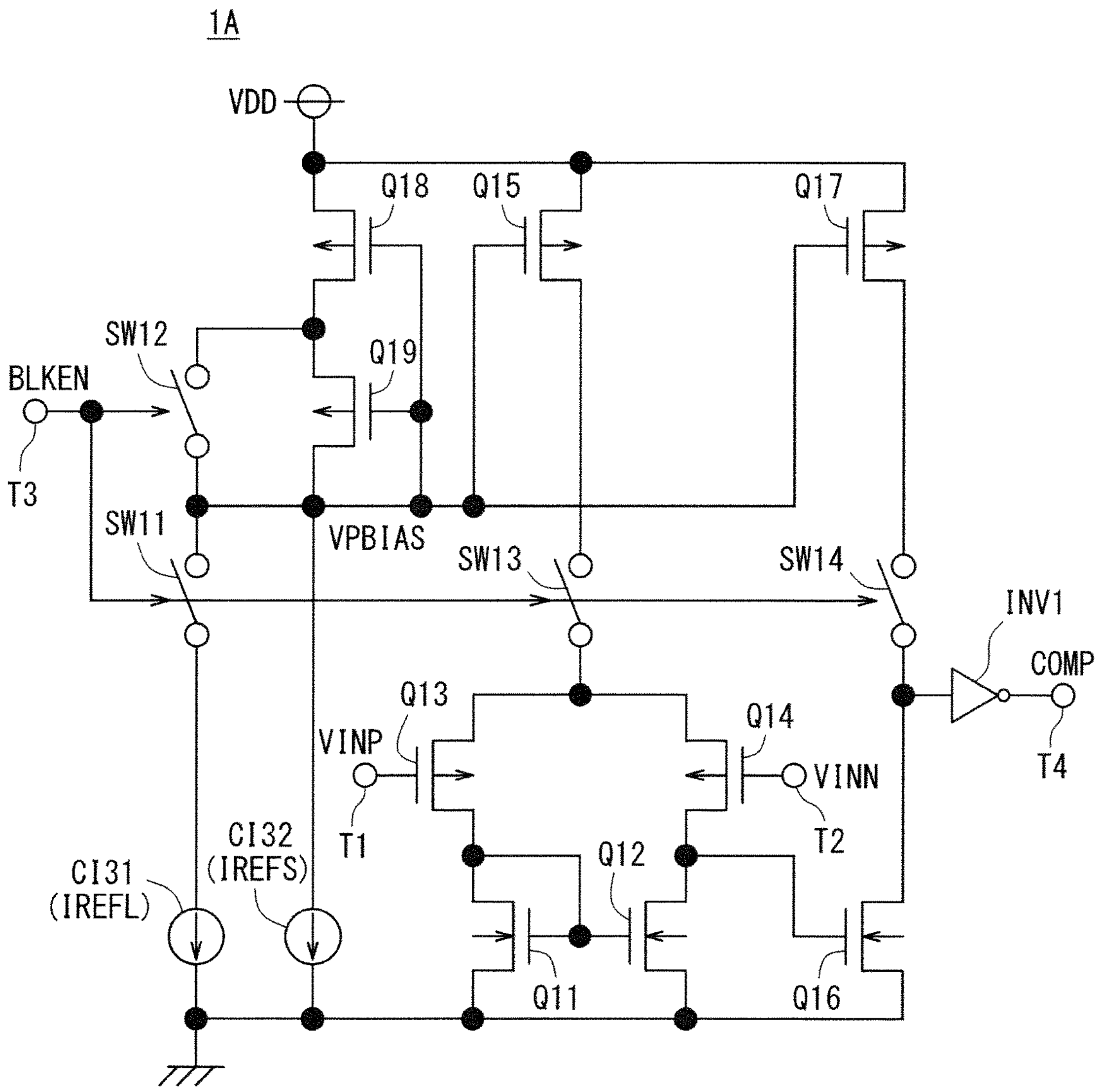
FIG. 15 is a circuit diagram illustrating a configuration example of a comparator circuit 1A according to a fifth embodiment.

FIG. 15 is a circuit diagram illustrating a configuration example of a comparator circuit 1A according to a fifth embodiment. The comparator circuit 1A in FIG. 15 is different from the comparator circuit 1 in FIG. 1 in the following points.

(1) Instead of the MOS transistors Q1 to Q7, MOS transistors Q11 to Q17 are provided. In this case, the MOS transistors Q13 to Q15 and Q17 are P-channel MOS transistors, and the MOS transistors Q11 to Q12 and Q16 are N-channel MOS transistors.

(2) Instead of the switches SW1 to SW4, switches SW11 to SW14 are provided.

As described above, by replacing some N-channel MOS transistors with P-channel MOS transistors, it is possible to use not only a current source on the ground side but also a current source on the power supply side. The same applies to the second to fourth embodiments.

The comparator circuit 1A configured as described above operates when the H-level block enable signal BLKEN is input, and can cause a current corresponding to IREFL+IREFS to flow through the MOS transistors Q15 and Q17.

As described above, according to the fifth embodiment, the desired comparison operation can be started immediately after switching to the increased consumption current according to the block enable signal BLKEN which is the operation mode switching control signal.

It is noted that the bias voltage generator in FIG. 15 may be configured by the circuit of the first to seventh modified embodiments in FIGS. 5 to 11 instead of the circuit in FIG. 15.

Sixth Embodiment

Figure 16:
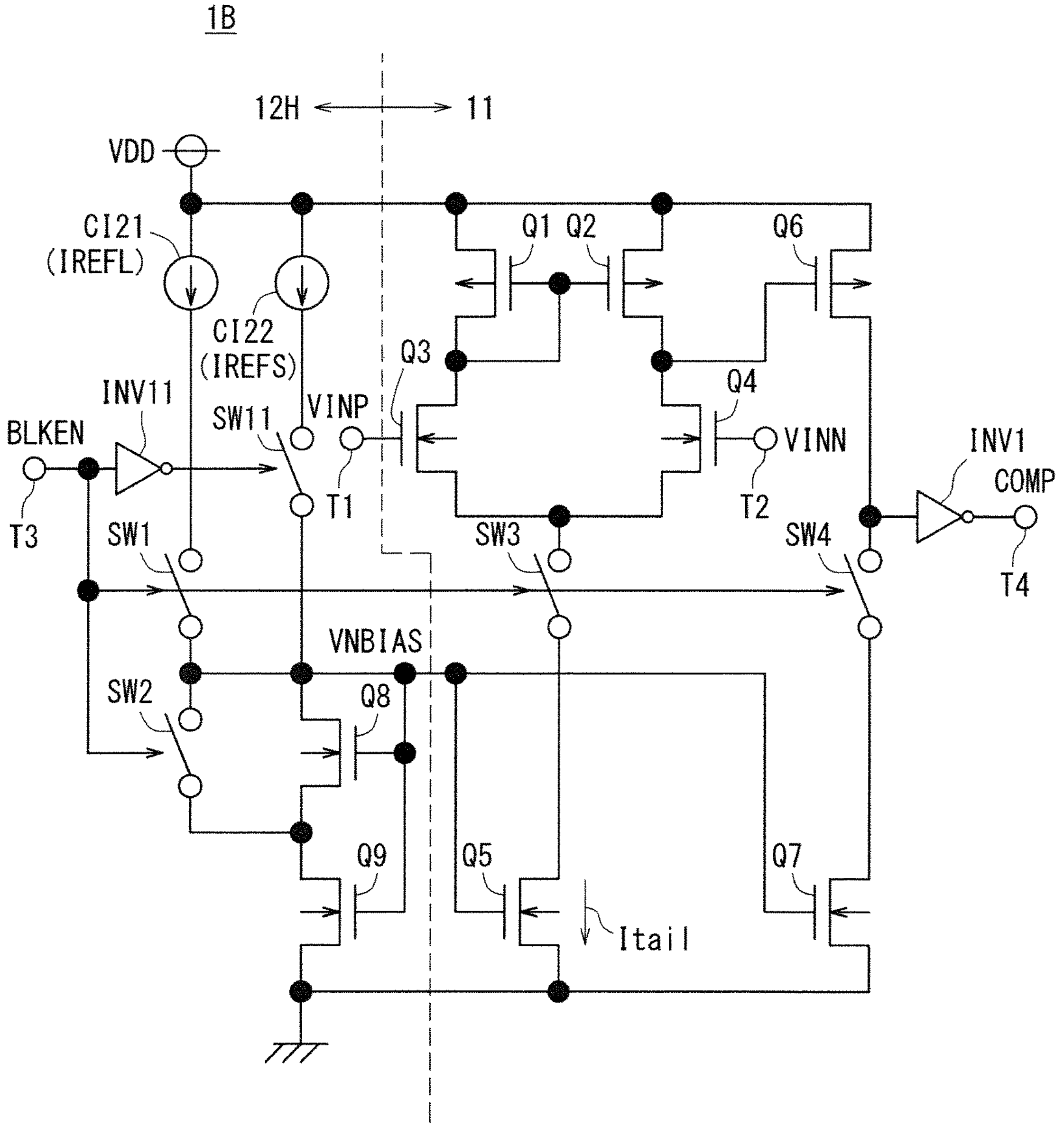
FIG. 16 is a circuit diagram illustrating a configuration example of a comparator circuit 1B according to a sixth embodiment.

FIG. 16 is a circuit diagram illustrating a configuration example of a comparator circuit 1B according to a sixth embodiment. The comparator circuit 1B in FIG. 16 is different from the comparator circuit 1 in FIG. 1 in the following points.

(1) A bias voltage generator 12H into which a switch SW11 is inserted is provided between the constant current source CI22 and the drain of the MOS transistor Q8.

(2) The block enable signal BLKEN is further input to the control terminal of the switch SW11 via an inverter INV11. That is, the bias voltage generator 12H generates a predetermined bias voltage based on a second constant current when the electronic circuit is not operated, and generates another predetermined bias voltage based on a first constant current when the electronic circuit is operated.

In the comparator circuit 1B configured as described above, when the block enable signal BLKEN has the L level, the switch SW11 is turned on, and a current according to IREFS can be caused to flow through the MOS transistors Q8 and Q9.

As described above, according to the sixth embodiment, the desired comparison operation can be started immediately after switching to the increased consumption current according to the block enable signal BLKEN which is the operation mode switching control signal.

Other Modified Embodiments

In the above embodiments and modified embodiments, the comparator circuit, the source follower circuit, the voltage generator circuit, and the time constant circuit are configured, but the present invention is not limited thereto, and various electronic circuits such as a differential amplifier circuit may be configured.

INDUSTRIAL APPLICABILITY

As mentioned above in details, according to the bias voltage generator circuit or the electronic circuit of the present invention, the gate voltage of the bias transistor is kept to be constant even if the current amount of the current source is reduced in order to reduce the consumption current according to the operation mode switching control signal, so that the desired operation can be started immediately after the operation mode switching control signal is switched.

The invention claimed is:

1. A bias voltage generator circuit comprising:

a first constant current source configured to supply a first constant current;

a second constant current source configured to supply a second constant current smaller than the first constant current; and a bias voltage generator including at least one first MOS transistor and being configured to generate a predetermined bias voltage based on the second constant current or the first and second constant currents, wherein the bias voltage generator circuit is provided for an electronic circuit to which a current is supplied by a current mirror circuit including the first MOS transistor and at least one second MOS transistor, wherein the bias voltage generator circuit is configured, based on an operation mode switching control signal, (1) to generate a predetermined bias voltage based on the second constant current when the electronic circuit does not operate, and (2) to generate a predetermined bias voltage based on the first and second constant currents or the first constant current when the electronic circuit operates.

2. The bias voltage generator circuit as claimed in claim 1, wherein the at least one first MOS transistor includes two MOS transistors connected in series to each other, and control terminals of the two MOS transistors are connected to each other.

3. The bias voltage generator circuit as claimed in claim 1, wherein the at least one first MOS transistor includes two MOS transistors connected in series to each other, and each of the two MOS transistors is diode-connected.

4. The bias voltage generator circuit as claimed in claim 1, wherein the at least one first MOS transistor includes two MOS transistors connected in parallel to each other and having different thresholds from each other.

5. The bias voltage generator circuit as claimed in claim 1, wherein the at least one first MOS transistor includes one third MOS transistor connected in series with a first resistor connected to the second constant current source, and wherein a control terminal of the third MOS transistor is connected to a connection point between the second constant current source and the resistor.

6. The bias voltage generator circuit as claimed in claim 1, wherein the at least one first MOS transistor includes one third MOS transistor connected in series with a first resistor connected to the second constant current source, and wherein the third MOS transistor is diode-connected.

7. The bias voltage generator circuit as claimed in claim 1, wherein the at least one first MOS transistor includes one third MOS transistor connected in series with a first diode connected to the second constant current source, and wherein the third MOS transistor is diode-connected.

8. The bias voltage generator circuit as claimed in claim 1, wherein the at least one first MOS transistor is configured by connecting a third MOS transistor connected to the second constant current source, with a second diode in series, and wherein the third MOS transistor is diode-connected.

9. An electronic circuit comprising a bias voltage generator circuit, the bias voltage generator circuit comprising:

a first constant current source configured to supply a first constant current;

a second constant current source configured to supply a second constant current smaller than the first constant current; and a bias voltage generator including at least one first MOS transistor and being configured to generate a predetermined bias voltage based on the second constant current or the first and second constant currents, wherein the bias voltage generator circuit is provided for an electronic circuit to which a current is supplied by a current mirror circuit including the first MOS transistor and at least one second MOS transistor, wherein the bias voltage generator circuit is configured, based on an operation mode switching control signal, (1) to generate a predetermined bias voltage based on the second constant current when the electronic circuit does not operate, and (2) to generate a predetermined bias voltage based on the first and second constant currents or the first constant current when the electronic circuit operates.

10. The electronic circuit as claimed in claim 9, wherein the at least one first MOS transistor includes two MOS transistors connected in series to each other, and control terminals of the two MOS transistors are connected to each other.

11. The electronic circuit as claimed in claim 9, wherein the at least one first MOS transistor includes two MOS transistors connected in series to each other, and each of the two MOS transistors is diode-connected.

12. The electronic circuit as claimed in claim 9, wherein the at least one first MOS transistor includes two MOS transistors connected in parallel to each other and having different thresholds from each other.

13. The electronic circuit as claimed in claim 9, wherein the at least one first MOS transistor includes one third MOS transistor connected in series with a first resistor connected to the second constant current source, and wherein a control terminal of the third MOS transistor is connected to a connection point between the second constant current source and the resistor.

14. The electronic circuit as claimed in claim 9, wherein the at least one first MOS transistor includes one third MOS transistor connected in series with a first resistor connected to the second constant current source, and wherein the third MOS transistor is diode-connected.

15. The electronic circuit as claimed in claim 9, wherein the at least one first MOS transistor includes one third MOS transistor connected in series with a first diode connected to the second constant current source, and wherein the third MOS transistor is diode-connected.

16. The electronic circuit as claimed in claim 9, wherein the at least one first MOS transistor is configured by connecting a third MOS transistor connected to the second constant current source, with a second diode in series, and wherein the third MOS transistor is diode-connected.

17. The electronic circuit as claimed in claim 9, wherein the electronic circuit is a comparator circuit, a source follower circuit, a voltage generator circuit, a time constant circuit, or a differential amplifier circuit.

* * * * *